(12) United States Patent
Mun

(10) Patent No.: US 7,223,625 B2
(45) Date of Patent: May 29, 2007

(54) CMOS IMAGE SENSOR AND METHOD FOR FABRICATING THE SAME

(75) Inventor: Jun Mun, Choongcheongbuk-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/024,312

(22) Filed: Dec. 29, 2004

(65) Prior Publication Data
US 2006/0033176 A1    Feb. 16, 2006

(30) Foreign Application Priority Data
Aug. 11, 2004   (KR) .................... 10-2004-0063032

(51) Int. Cl.
    *H01L 21/00*      (2006.01)
(52) U.S. Cl. .................... 438/57; 438/70; 438/73; 257/E31.001
(58) Field of Classification Search ........... 438/57–99
    See application file for complete search history.

(56) References Cited

U.S. PATENT DOCUMENTS

| 6,127,668 | A | * | 10/2000 | Baek | ................. | 250/208.1 |
| 6,232,590 | B1 | * | 5/2001 | Baek | ................. | 250/208.1 |

FOREIGN PATENT DOCUMENTS

| JP | 62-013067 | | 1/1987 |
| JP | 05-228946 | | 9/1993 |
| JP | 06-018871 | | 1/1994 |
| JP | 2002-148411 | | 5/2002 |
| JP | 2003-060176 | | 2/2003 |
| JP | 2003-084276 | | 3/2003 |
| JP | 2003-209231 | | 7/2003 |
| JP | 2003222705 | * | 8/2003 |
| KR | 10-2000-60698 | | 10/2000 |

OTHER PUBLICATIONS

Office Action from the Japanese Intellectual Property Office, dated Jun. 19, 2006, in counterpart Japanese Patent Application No. 2004-376938.

* cited by examiner

*Primary Examiner*—Savitri Mulpuri
(74) *Attorney, Agent, or Firm*—Finnegan, Henderson, Farabow, Garrett, & Dunner, L.L.P.

(57) ABSTRACT

A complementary metal-oxide semiconductor (CMOS) image sensor and a method for fabricating the same are disclosed. The CMOS image sensor a plurality of photosensitive devices formed on a semiconductor substrate, an interlayer dielectric formed on the photosensitive devices, and a plurality of color filter layers facing into each interlayer dielectric and filtering light for each wavelength, a planarization layer formed on each of the color filter layers, and a micro-lens layer formed on the planarization layer and having a refractive index distribution, in which light is focused to the photosensitive device facing thereto, based on an ion injection profile.

2 Claims, 5 Drawing Sheets

CMOS IMAGE SENSOR AND METHOD FOR FABRICATING THE SAME

This application claims the benefit of the Korean Patent Application No. 10-2004-0063032, filed on Aug. 11, 2004, which is hereby incorporated by reference as if fully set forth herein.

BACKGROUND OF THE INVENTION

1. Field of the Invention

The present invention relates to an image sensor, and more particularly, to a complementary metal-oxide semiconductor (CMOS) image sensor and a method for fabricating the same. Although the present invention is suitable for a wide scope of applications, it is particularly suitable for forming a micro-lens by an ion injection process without a reflow process, so as to obtain a desired refractive index distribution, thereby accurately controlling light concentration.

2. Discussion of the Related Art

Generally, an image sensor is a semiconductor device which converts an optical image to an electric signal. There are two kinds of image sensor devices: a charge coupled device (hereinafter referred to as CCD) and a complementary metal-oxide semiconductor (hereinafter referred to as CMOS). The CMOS image sensor includes a photodiode unit which detects irradiated light, and a CMOS logic circuit which processes the electric signal to form data. Moreover, as the amount of light received in the photodiode increases, the photo-sensitivity of the light sensor will increase accordingly.

In order to increase the photo sensitivity, either a fill factor of the photodiode area within the total area of the image sensor needs to be increased, or an optical path of the light irradiated process to the area outside of the photodiode needs to be changed so as to focus light onto the photodiode. The main examples of the light-focusing method would be to form a micro-lens. The related art shows a convex micro-lens formed of a material having an excellent light-transmission ratio is provided on the photodiode. Thus, the optical path of the irradiated light is refracted, so as to irradiate a larger amount of light to the photodiode. In this case, the micro-lens refracts the light being parallel to the optical axis, so as to form a focal point of the light on a specific point of the optical path.

A related art CMOS image sensor and fabrication of a micro-lens thereof will now be described with reference to the accompanying drawings. FIG. 1 is a cross-sectional view of a related art CMOS image sensor. As shown in FIG. 1, the related art CMOS image sensor includes a semiconductor substrate (not shown), a sub layer 11, an interlayer dielectric 12, R, G, and B color filter layers 13, a planarization layer 14, and a micro-lens 15. The sub layer 11 includes at least one photodiode area and metal lines, wherein the photodiode area generates electric charges depending upon the amount of irradiated light. The interlayer dielectric 12 is formed on an upper surface of the sub layer. R, G, and B color filter layers 13 formed on the insulation layer 12 enable light of each specific wavelength to pass through. The planarization layer 14 is formed on the R, G, and B color filter layers 13. And, the micro-lens 15 is formed on the planarization layer 14 and has a convex shape having a set curvature, so that light can pass through the color filter layers 13 facing thereto and that the light is focused onto the photodiode area.

Furthermore, although not shown in the drawings, an optical shielding layer is formed within the interlayer dielectric. The optical shielding layer is formed to prevent light from being irradiated onto an area outside of the photodiode area. Also, the photosensitive device may also be formed to have a structure of a photo-gate, instead of the structure of a photodiode.

Herein, the micro-lens 15 is mainly formed of a polymer group resin by using deposition, patterning, and reflow processes. Additionally, a curvature and thickness of the micro-lens 15 are decided by taking into account various factors, such as the focal point of a focused light. More specifically, the micro-lens 15 should be formed to have optimum size, thickness, and curvature radius, which is decided by the size, position, shape of the unit pixel, the thickness of the photosensitive device, and the height, position, and size of the optical shielding layer.

The most important process in the fabrication process of the micro-lens is a space CD controlling process, in which the space between the lenses is controlled, and also a curvature forming process, in which the optimum curvature of the lens is formed. More specifically, by adequately controlling the curvature of the lens, the optical signal passing through a color filter array is efficiently transmitted to the photosensitive device.

However, the related art CMOS image sensor and method of fabricating same have the following disadvantages. In the related art fabrication method, the CMOS image sensor is fabricated by first forming a rectangular lens array, which is spaced apart by using photoresist layers, and then forming the curvature of the lens by using a reflow process. Thus, it is difficult to provide an adequate space between the lenses. Moreover, when the lenses are not accurately spaced apart from one another, excessive noise may occur during an image processing step, or a sufficient size of the signal may not be provided.

Furthermore, when using the above-described semi-spherical micro-lens, the irradiated light, which is parallel to the optical axis, is refracted from the lens, so as to be transmitted to the photosensitive device facing into the lens, thereby driving the device. However, when light that is not parallel to the optical axis is refracted from the lens, the refracted light may be incorrectly irradiated to a photosensitive device located in a different optical path, thereby causing misoperation. And, finally, the difference in the amount of light being transmitted to the photosensitive device may vary depending upon the type of material and size used to form the lower layer of the micro-lens, thereby reducing light-focusing efficiency and deteriorating image quality.

SUMMARY OF THE INVENTION

Accordingly, the present invention is directed to a complementary metal-oxide semiconductor (CMOS) image sensor and a method for fabricating the same that substantially obviate one or more problems due to limitations and disadvantages of the related art.

An object of the present invention is to provide a complementary metal-oxide semiconductor (CMOS) image sensor and a method for fabricating the same, which forms a micro-lens by an ion injection process, instead of a reflow process, so as to obtain a desired refractive index distribution, thereby accurately controlling light concentration.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a complementary metal-oxide semiconductor image sensor includes a plurality of photosensitive devices formed on a semiconductor substrate, an interlayer dielectric formed on the photosensitive devices, and a plurality of color filter layers facing into each interlayer dielectric and filtering light for each wavelength, a planarization layer formed on each of the color filter layers, and a micro-lens layer formed on the planarization layer and having a refractive index distribution, in which light is focused to the photosensitive device facing thereto, based on an ion injection profile.

In another aspect of the present invention, a method of fabricating a complementary metal-oxide semiconductor image sensor includes forming interlayer dielectrics on a plurality of photosensitive devices formed on a semiconductor substrate, forming a plurality of color filter layers on the interlayer dielectrics, each of the color filter layers facing into each photosensitive device, forming a planarization layer on the color filter layers, and depositing a lens-forming material layer on the planarization layer, and forming a micro-lens layer having a refractive index distribution, in which light is focused onto the photosensitive device facing thereto, by using an ion injection and dispersion process.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
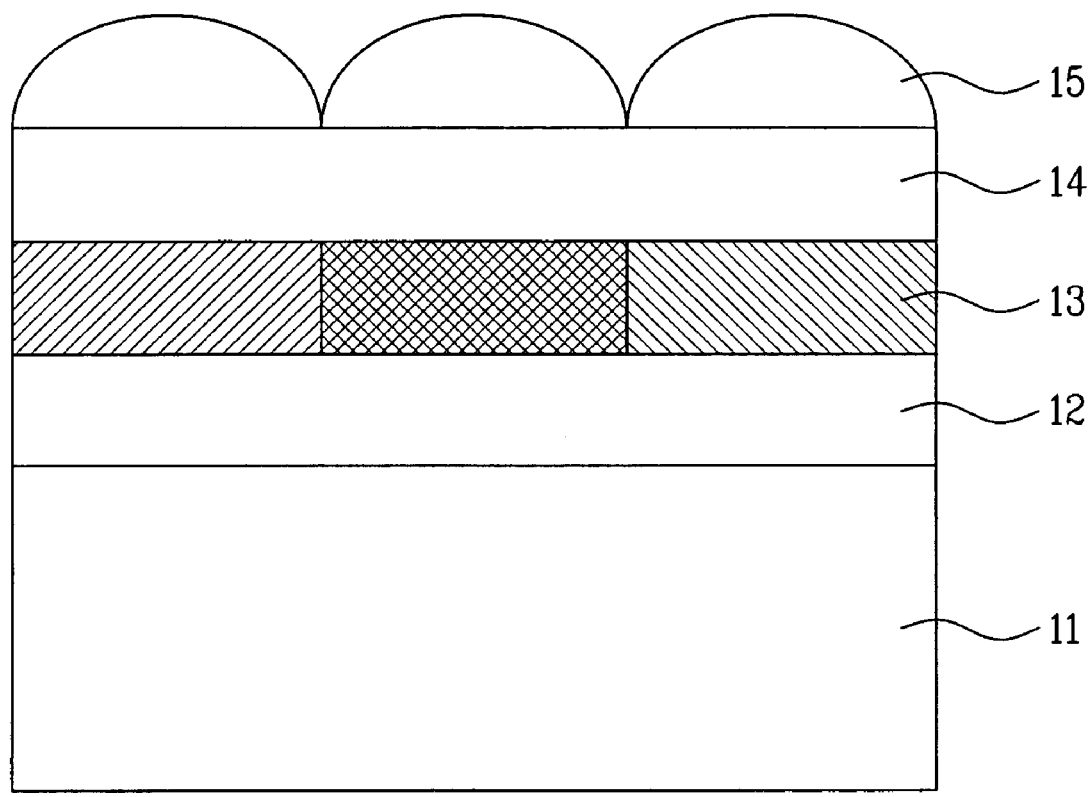
FIG. 1 is a cross-sectional view of a related art CMOS image sensor.
Figure 2A:
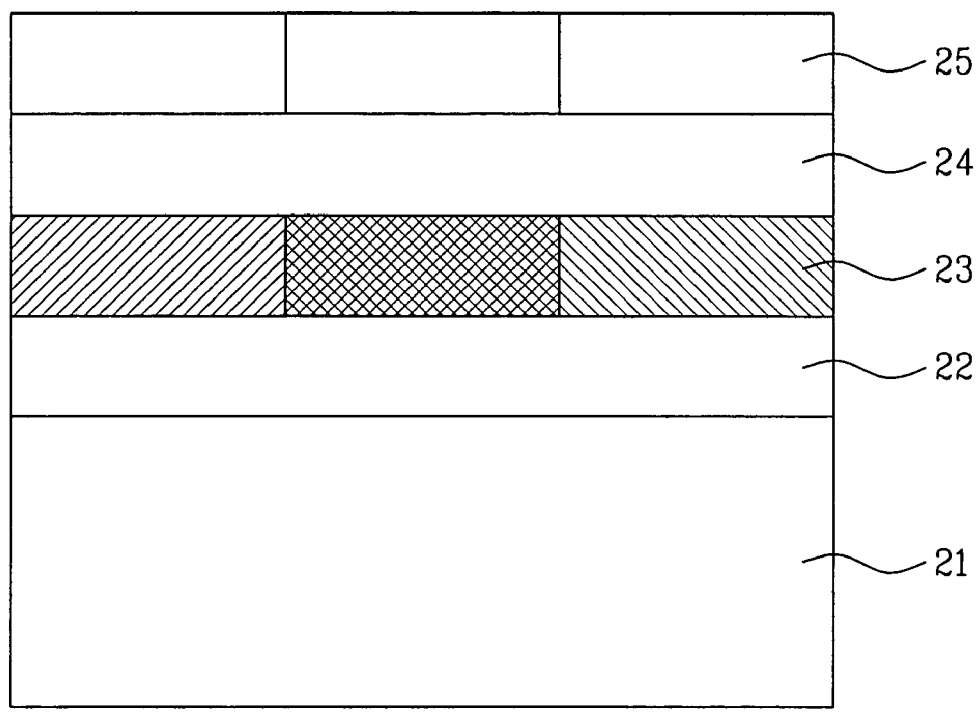
FIGS. 2A and 2B respectively illustrate a cross-sectional view of a CMOS image sensor including a GRIN microlens, which has a refractive index due to ion injection and dispersion, and a graph showing the refractive index distribution.
Figure 2B:
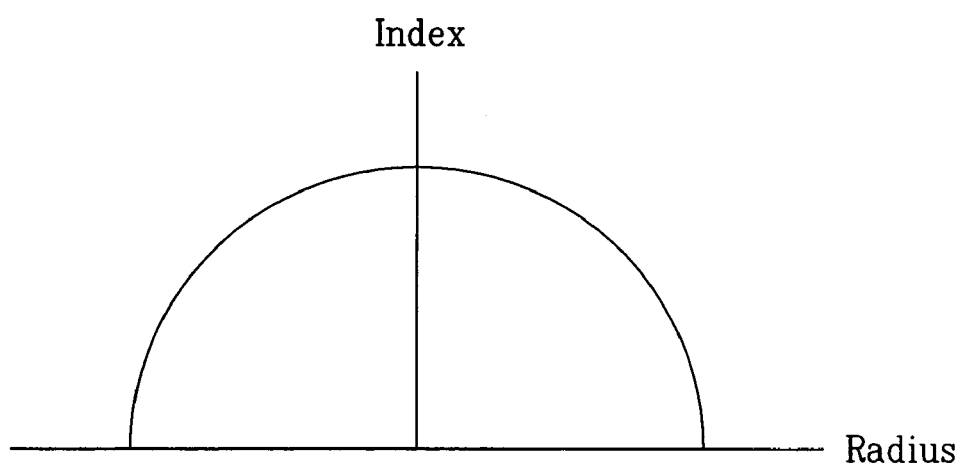

FIGS. 2A and 2B respectively illustrate a cross-sectional view of a CMOS image sensor including a GRIN microlens, which has a refractive index due to ion injection and dispersion, and a graph showing the refractive index distribution. Herein, a micro-lens is formed on an upper surface of a color filter array, and the micro-lens focuses irradiated light to a photosensitive area of the CMOS image sensor. Instead of using the reflow process to form the curvature of the micro-lens, an ion injection and dispersion process is used, which can allow the irradiated light to be refracted and focused to a center portion of the image sensor.

Referring to FIG. 2A, the CMOS image sensor according to the present invention includes a semiconductor substrate (not shown), a sub layer 21, an interlayer dielectric 22, R, G, and B color filter layer 23, a planarization layer 24, and a micro-lens 25. More specifically, the sub layer 21 including at least one photodiode area and metal lines is formed on the semiconductor substrate (not shown). Herein, the photodiode area generates electric charges in accordance with the amount of light received thereto. The interlayer dielectric 22 is formed on an entire surface of the sub layer 21, and the R, G, and B color filter layer 23 that transmits light of each specific wavelength is formed on the interlayer dielectric 22. Then, the planarization layer 24 is formed on the color filter layer 23. Finally, the micro-lens 25 having a flat surface is formed on the planarization layer 24. The micro-lens 25 focuses the irradiated light by using the refractive index distribution according to an ion injection profile, thereby irradiating the focused light to the photodiode area through the color filter layer 23, which faces into the micro-lens 25.

The micro-lens according to the present invention, is an application of a gradient index (GRIN) lens, which is mainly used in optical pick-up. In order to resolve the problems of controlling lens curvature and controlling CD between the micro-lenses caused by the reflow process, the micro-lens according to the present invention is formed by using an ion injection and dispersion method, which can distribute light that is focused by a refractive index. Although the micro-lens layer is formed to have a flat structure, a refractive index distribution, as shown in FIG. 2B, may be provided by an ion injection profile.

Figure 3A:
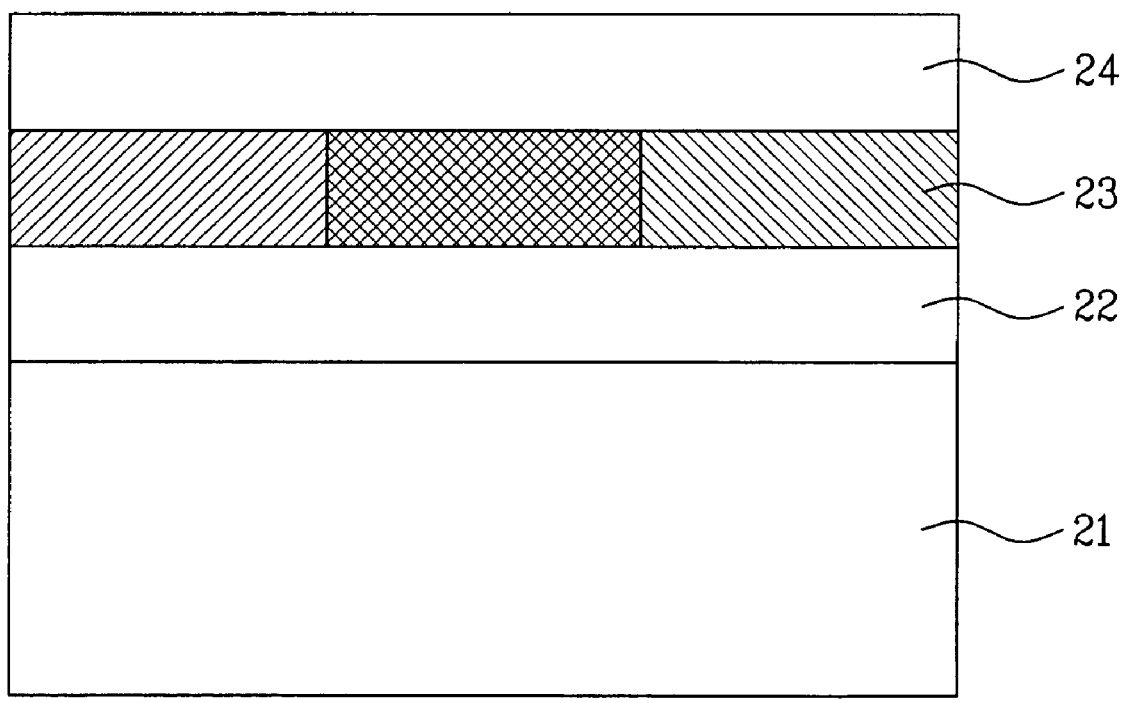
FIG. 3A to FIG. 3C illustrate cross-sectional views showing process steps of a method for fabricating the CMOS image sensor according to the present invention.
Figure 3B:
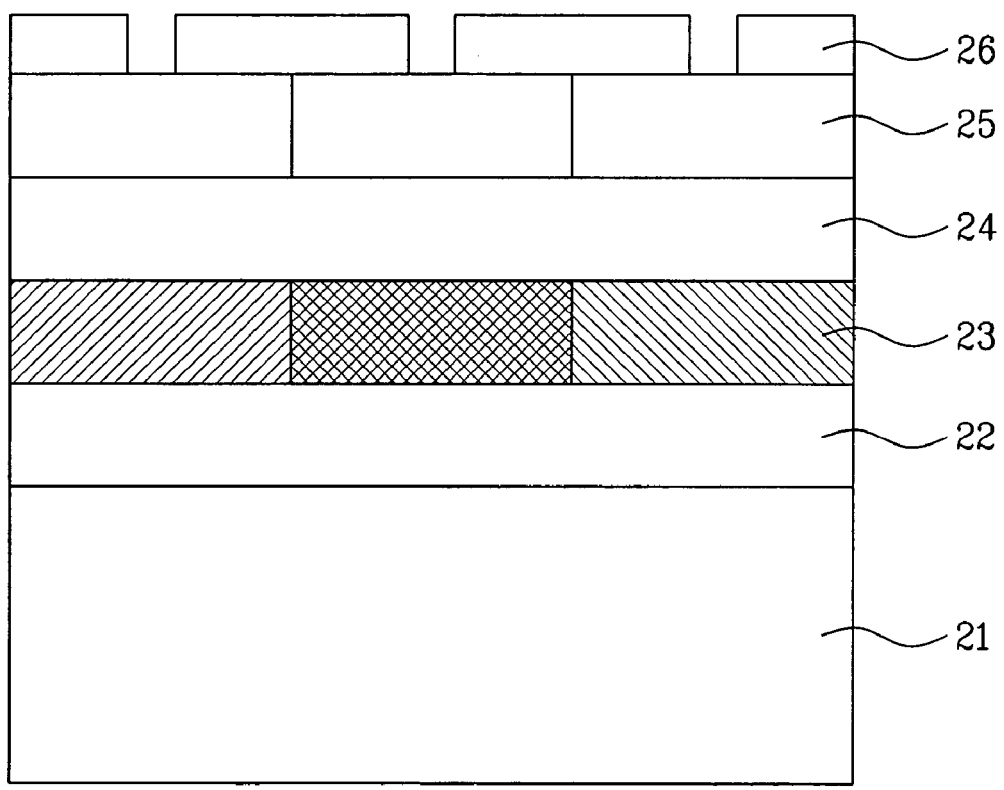
Figure 3C:
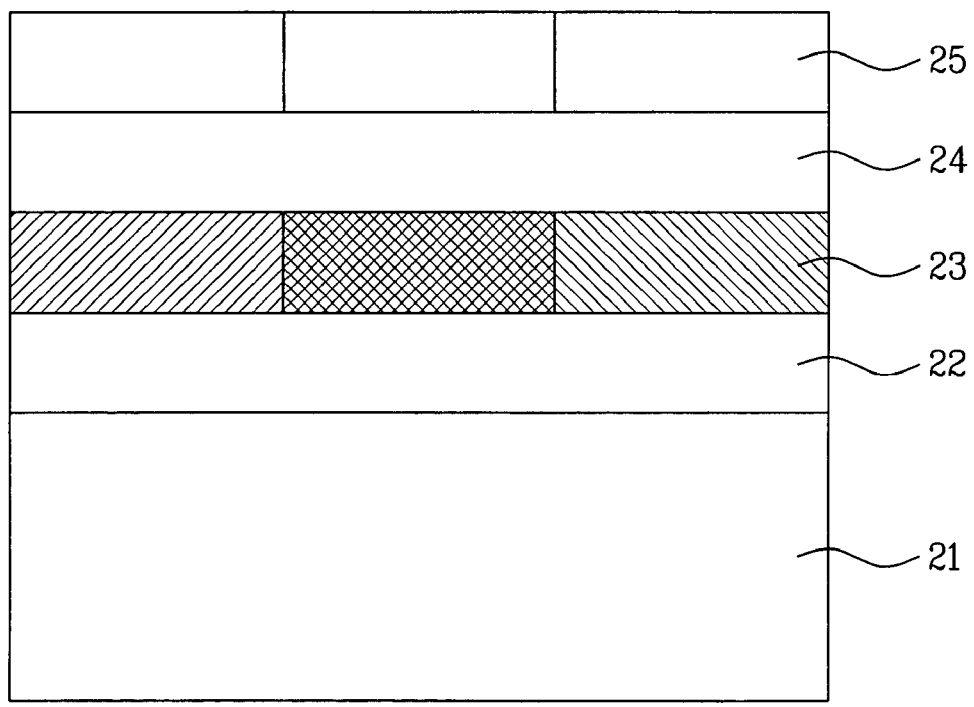

Hereinafter, the process steps for fabricating the CMOS image sensor according to the present invention will be described in detail. FIG. 3A to FIG. 3C illustrate cross-sectional views showing process steps of a method for fabricating the CMOS image sensor according to the present invention.

Referring to FIG. 3A, the interlayer dielectric 22 is formed on the sub layer 21 having a plurality of photosensitive devices, such as photodiodes, and metal lines formed thereon. Herein, the interlayer dielectric 22 can be formed in a multiple-layered structure, and, although not shown in the drawing, after forming an interlayer dielectric, an optical shielding layer that prevents light from being irradiated to a portion outside of the photodiode area may be formed, and then, another interlayer dielectric may be formed thereon.

Subsequently, a planarized protective layer (not shown) is formed on the interlayer dielectric 22, so as to protect the device from moisture and scratches, and then, color filter layers 23, which filter light for each wavelength, are formed by performing deposition and patterning processes using tangible resist. Thereafter, a planarization layer 24 is formed to ensure the flat surface of the device, thereby controlling a focal point distance and forming a lens layer.

Then, as shown in FIG. 3B, a lens-forming material is deposited, which is then selectively patterned to form the rectangular lens layer. Subsequently, a mask layer 26 opening the center portion of the rectangular lens layer is formed, so as to carry out an impurity ion injection process. Referring to FIG. 3C, the mask layer 26 is removed, and the impurity ions injected into the lens layer are dispersed, thereby forming the micro-lens layer 25 having the refractive index distribution, as shown in FIG. 2B. The above-described micro-lens layer 25 has a different focal point depending upon the thickness of the lens. Therefore, deciding the thickness of the lens becomes an important factor for concentrating the optical signal to a desired point (or location), which is more simple than controlling the curvature of the lens when using the reflow process.

Conclusively, in the CMOS image sensor and the method for fabricating the same, instead of using a reflow process (or curvature forming process) for controlling the refractive index of the micro-lens layer, the refractive index of the present invention is controlled by controlling an ion injection profile, thereby facilitating the fabrication process and enhancing the light-focusing efficiency, which can be obtained by accurately controlling the refractive index.

As described above, the CMOS image sensor and the method for fabricating the same have the following advantages. By forming a micro-lens in a flat shape instead of a convex shape, the problems of controlling curvature of the lens and controlling space CD (i.e., space between the lenses) can be resolved. Moreover, instead of focusing light by using the curvature of a spherical lens, the light can be more accurately focused by controlling the refractive index through an ion injection process. Finally, as the light focusing efficiency is increased, the amount of light transmitted through the color filters and onto the photodiode is also increased accordingly, thereby enhancing color representation of the images.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of fabricating a complementary metal-oxide semiconductor image sensor, comprising:
    forming interlayer dielectrics on a plurality of photosensitive devices formed on a semiconductor substrate;
    forming a plurality of color filter layers on the interlayer dielectrics, each of the color filter layers facing into each photosensitive device;
    forming a planarization layer on the color filter layers;
    depositing a lens-forming material layer on the planarization layer; and
    injecting and dispersing ions onto the lens-forming material layer to form a micro-lens layer having a refractive index distribution, in which light is focused onto the photosensitive device facing thereto,
    wherein the ions are injected by using a mask layer, the mask layer having an opening corresponding to a center portion of the lens-forming material layer, and wherein the lens-forming material is patterned to have a rectangular shape.

2. The method of claim 1, wherein said injecting and dispersing of ions is performed after said patterning the lens-forming material layer to have the rectangular shape, so that the lens-forming material layer faces into each of the photosensitive devices.

* * * * *